(12) United States Patent
Lee

(10) Patent No.: US 6,720,779 B1
(45) Date of Patent: Apr. 13, 2004

(54) DEFECT TYPE IDENTIFICATION USING HYPER-EXTRACTING-FIELD

(75) Inventor: Paul S. Lee, Sunnyvale, CA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 0 days.

(21) Appl. No.: 10/192,299

(22) Filed: Jul. 10, 2002

(51) Int. Cl.[7] .............................................. G01R 31/305
(52) U.S. Cl. ...................................................... 324/751
(58) Field of Search ................................. 324/750, 751, 324/158.1, 765; 250/307, 311, 396 R, 397, 398–399

(56) References Cited

U.S. PATENT DOCUMENTS 5,523,694 A * 6/1996 Cole, Jr. ...................... 324/751
5,781,017 A * 7/1998 Cole et al. ................... 324/751

* cited by examiner

Primary Examiner—David A. Zarneke
Assistant Examiner—Tung X. Nguyen
(74) Attorney, Agent, or Firm—Okamoto & Benedicto LLP

(57) ABSTRACT

One embodiment disclosed relates to a method for electron beam inspection of a semiconductor circuit to identify a defect path using a hyper-extracting field. The method includes scanning the semiconductor circuit with a primary electron beam, applying a hyper-extracting field sufficient to achieve a junction breakdown, detecting intensities of electrons hyper-extracted from the semiconductor circuit during the scanning, and identifying a defect path from the hyper-extracted intensities. Another embodiment disclosed relates to a method that includes identifying both a normally extracting voltage contrast defect and a normally retarding voltage contrast defect by using the hyper-extracting field. Another embodiment disclosed relates to an apparatus for electron beam inspection of a semiconductor circuit to identify a defect path using a hyper-extracting field. Another embodiment disclosed relates to an apparatus for identifying both a normally extracting voltage contrast defect and a normally retarding voltage contrast defect by using the hyper-extracting field.

8 Claims, 16 Drawing Sheets

DEFECT TYPE IDENTIFICATION USING HYPER-EXTRACTING-FIELD

BACKGROUND OF THE INVENTION

1. Field of the Invention

The present invention relates generally to electron beam systems. The present invention more particularly relates to scanning electron microscopes in voltage contrast mode.

2. Description of the Background Art

A Scanning Electron Microscope (SEM) may be capable of Voltage Contrast inspection of a specimen (SEM-VC). SEM-VC inspection typically uses low landing energies and high electron current.

The specimen may be, for example, a semiconductor wafer with memory arrays thereon. The memory array may include, for example, three different types of contacts as illustrated in FIG. 1. FIG. 1 depicts examples of an N+ contact 102, a P+ contact 104, and a gate contact 106. The N+ contact 102 comprises a tungsten (W) plug to polysilicon over a N+ contact well within a surrounding P well. The P+ contact 104 comprises a tungsten plug to a P+ contact well within a surrounding N well. The gate contact 106 comprises a tungsten plug to a floating gate that is separated from an N or a P well by a thin gate oxide layer. The examples in FIG. 1 are formed on a P substrate. Alternatively, of course, such structures may be formed on an N substrate.

Consider, for example, the N+ contacts 102. A conventional retarding voltage may be applied between an (extracting) electrode above the specimen and the specimen stage. The retarding voltage causes electrons to build up on those tungsten plugs that are floating due to the N+ contact 102 being a defective open circuit. This is because the open circuit prevents the electrons from "draining away" from those tungsten plugs. The excess electrons at the surface of those tungsten plugs make them appear brighter in the SEM-VC retarding mode image. An example of this is illustrated in FIG. 2A. The brighter area in FIG. 2A is indicates the presence of open N+ contacts 102 in that area.

Alternatively, a conventional extracting voltage may be applied between the electrode above the specimen and the specimen stage. The extracting voltage causes electrons to be extracted from the tungsten plugs of normal N+ contacts 102. The extraction of electrons from a normal N+ contact 102, however, results in the N+ contact well becoming relatively positive charged. The positive charge of the N+ contact well causes the PN diode (from the surrounding P well to the N+ contact well) to be reversed biased. The reversed biased diode constrains and limits the flow of electrons out of the N+ contacts 102. The lesser flow of electrons the normal N+ contacts makes their tungsten plugs appear somewhat dim in the SEM-VC image. On the other hand, a shorted N+ contact 102 may have a short circuit that goes directly from the polysilicon to the P well (bypassing the PN reverse biased junction). Such a shorted contact would not have a reversed bias diode to constrain the flow of extracted electrons. Thus, a plug associated with a shorted N+ contact would appear brighter in an SEM-VC extraction mode image than would a plug associated with a normal N+ contact 102. An example of this is illustrated in FIG. 2B. The brighter area in FIG. 2B indicates the presence of shorted N+ contacts 102 in that area. Note that the image in FIG. 2B is roughly of the same area from the same memory as the image in FIG. 2A.

While conventional voltage contrast techniques are useful as described above, further improvement in defect detection techniques is desirable.

SUMMARY

One embodiment of the invention relates to a method for electron beam inspection of a semiconductor circuit to identify a defect path using a hyper-extracting field. The method includes scanning the semiconductor circuit with a primary electron beam, applying a hyper-extracting field sufficient to achieve a junction breakdown, detecting intensities of electrons hyper-extracted from the semiconductor circuit during the scanning, and identifying a defect path from the hyper-extracted intensities.

Another embodiment of the invention relates to a method that includes identifying both a normally extracting voltage contrast defect and a normally retarding voltage contrast defect by using the hyper-extracting field.

Another embodiment of the invention relates to an apparatus for electron beam inspection of a semiconductor circuit to identify a defect path using a hyper-extracting field.

Another embodiment of the invention relates to an apparatus for identifying both a normally extracting voltage contrast defect and a normally retarding voltage contrast defect by using the hyper-extracting field.

DETAILED DESCRIPTION

Figure 3A:
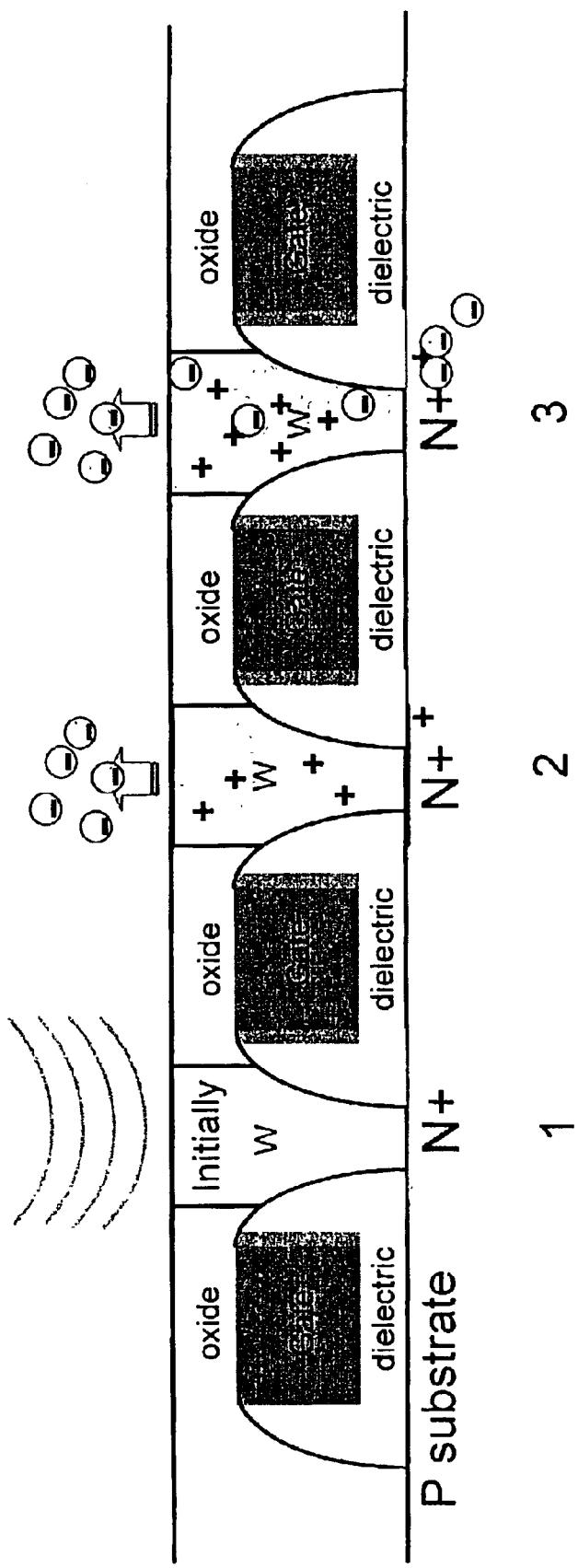
FIG. 3A is a cross-sectional diagram depicting a normal N+ contact at three different points in time when a hyper-extracting voltage is applied in accordance with an embodiment of the invention.

FIG. 3A is a cross-sectional diagram depicting a normal N+ contact 102 at three different points in time when a hyper-extracting voltage is applied in accordance with an embodiment of the invention. The diagram depicts an initial point in time (on the left) 1, an intermediate point in time (in the middle) 2, and a later point in time (on the right) 3.

At the initial point in time 1, a hyper-extracting field is applied between the specimen and an intermediate (extracting) electrode. As discussed further below in relation to the later point in time 3, the extracting field is of sufficiently high voltage to induce junction breakdown at the PN diode formed by the N+ contact well and the surrounding P well. For example, the hyper-extracting field may be set to nine hundred volts by applying having the specimen stage at negative 9,200 volts and the intermediate electrode at negative 8,300 volts. In that example, the electron source may, for instance, be set to negative 10,000 volts so that the landing energy is 800 electron volts (eV). Of course, various factors relating to the particular specimen and the inspection system being used affect the appropriate hyper-extracting and landing voltages.

At the intermediate point in time 2, electrons are being extracted from the normal N+ contact 102 via the surface of the tungsten plug. The extraction of electrons from the N+ contact 102 results in the N+ contact well becoming relatively positive charged. The positive charge of the N+ contact well causes the PN diode (from the surrounding P well to the N+ contact well) to be reversed biased. The reversed biased diode constrains and limits the flow of electrons to the N+ well and out of the N+ contact 102. The lesser flow of electrons from the normal N+ contacts 102 makes their tungsten plugs appear somewhat dim in the SEM-VC image.

At the later point in time 3, electrons are being "hyper-extracted" from the normal N+ contact 102 via the surface of the tungsten plug. The hyper-extraction of electrons from the N+ contact 102 results in the N+ contact well becoming even more positively charged. This greater positive charge of the N+ contact well causes the PN diode (from the surrounding P well to the N+ contact well) to undergo a junction breakdown. The junction breakdown causes the PN diode to no longer constrain the flow of electrons to the N+ well and out of the N+ contact 102. The greater flow of electrons the normal N+ contacts 102 makes their tungsten plugs appear brighter in the SEM-VC image.

Figure 3B:
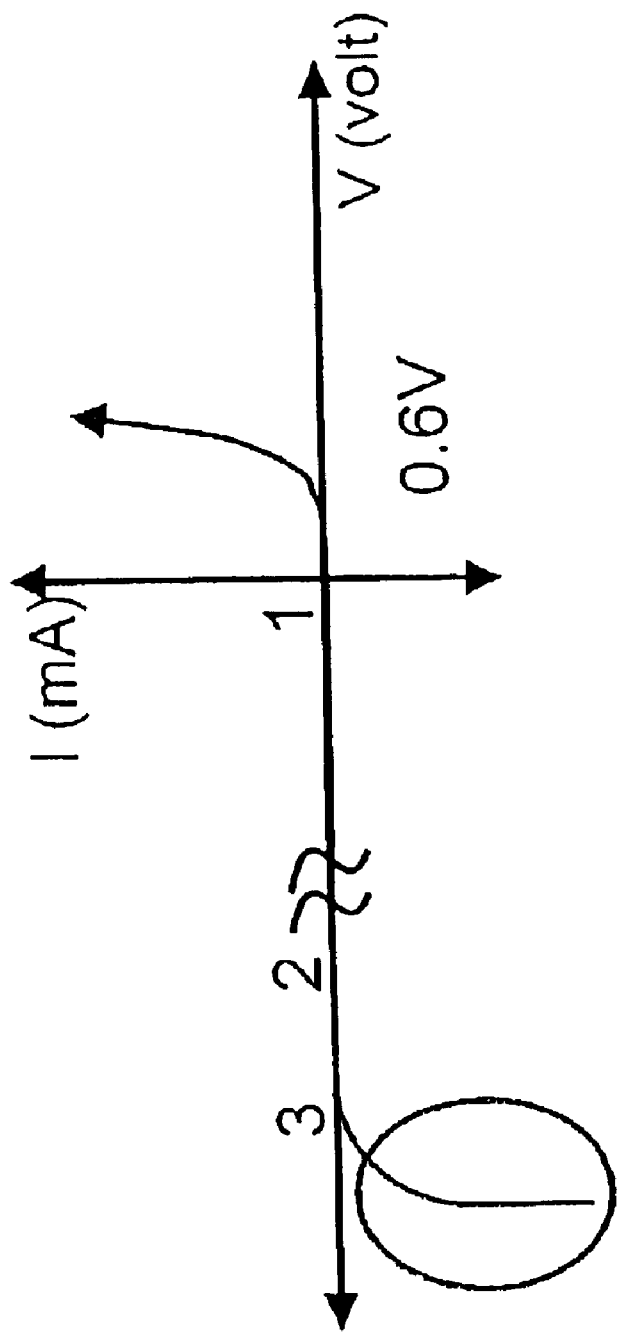
FIG. 3B is a graph of electron current versus voltage for the PN diode that helps to explain the behavior of the N+ contact when a hyper-extracting voltage is applied in accordance with an embodiment of the invention.

FIG. 3B is a graph of electron current (I) versus voltage (V) for the PN diode that helps to explain the behavior of the N+ contact 102 when a hyper-extracting voltage is applied in accordance with an embodiment of the invention. The PN diode is that formed by the N+ well and the surrounding P well. The initial point in time 1, intermediate point in time 2, and later point in time 3 from FIG. 3A. are also indicated in FIG. 3B. At the initial point in time 1, the hyper-extracting voltage is just applied, so there is initially close to zero volts applied across the PN junction and very little electron current flowing across the PN junction. At the intermediate point in time 2, the electrons have begun to flow from the N+ contact 102 and so the N+ contact well is becoming positively charged. This results in a negative voltage being applied across the PN junction and hence the junction being reversed biased. With the reverse biasing, very little electron current flows across the junction. Finally, at the later point in time 3, junction breakdown occurs due to a sufficiently high reverse bias voltage being applied across the PN junction. Due to the junction breakdown, reverse current flows (junction leakage) across the PN junction with the electrons flowing from the surrounding P well to the N+ contact well. In charging up the N+ W plugs, local field also plays a role, and the control of other inspection parameters such as beam density, charging rate and scanning method is also significant. The applicant believes that the IV curve of the PN diode remains near the cusp of the junction breakdown. This should be the case because greater electron flow to the N+ well should reduce the reverse biasing voltage across the PN junction. Thus, repeated scans should result in an "dynamic" equilibrium state somewhere near the cusp of the breakdown.

Figure 2A:
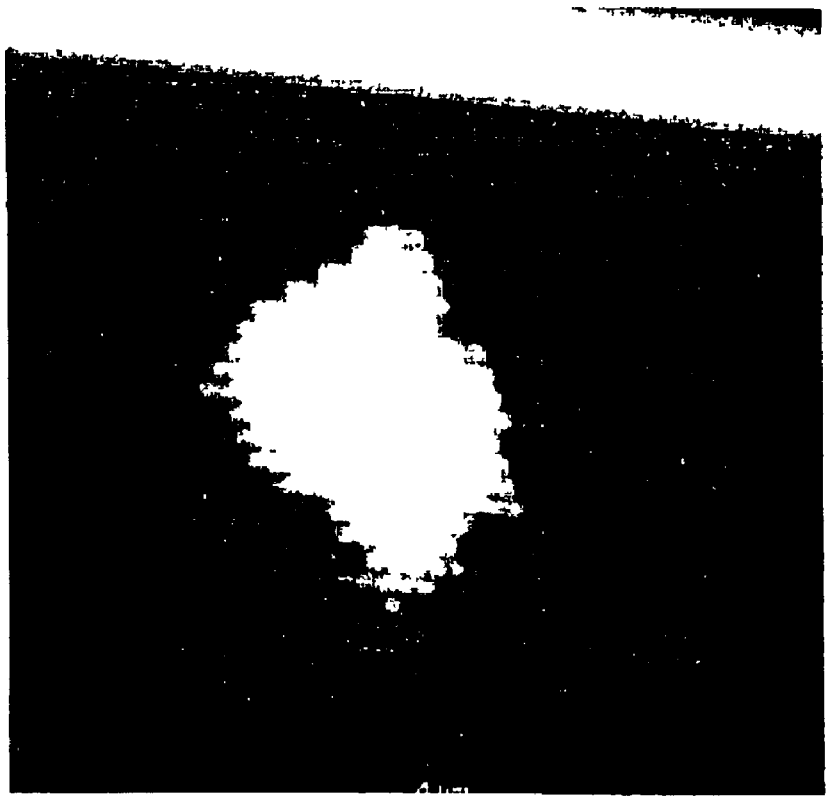
FIG. 2A depicts a conventional SEM-VC retarding mode image showing an area with open N+ contacts.
Figure 2B:
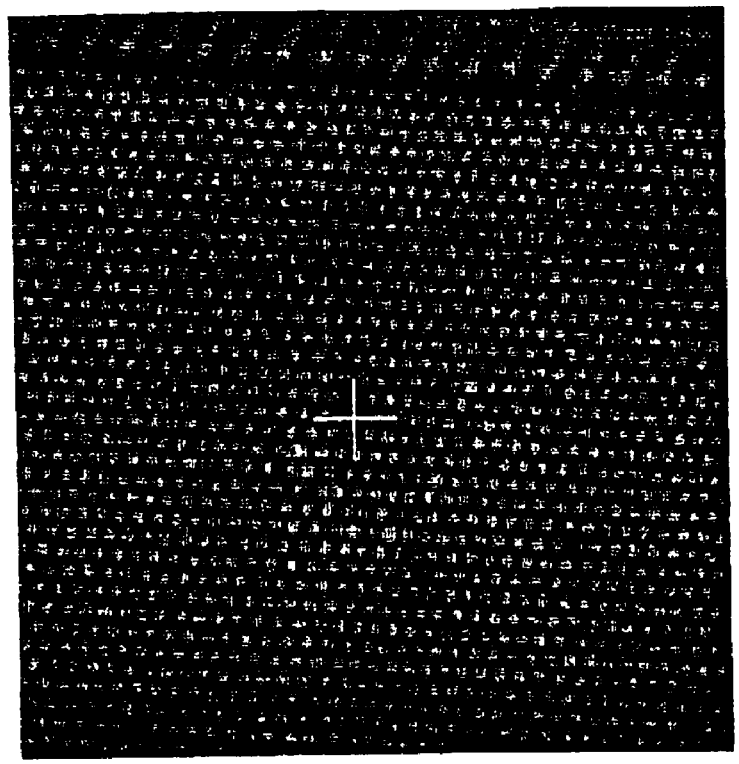
FIG. 2B depicts a conventional SEM-VC extracting mode image showing an area with shorted N+ contacts.
Figure 4:
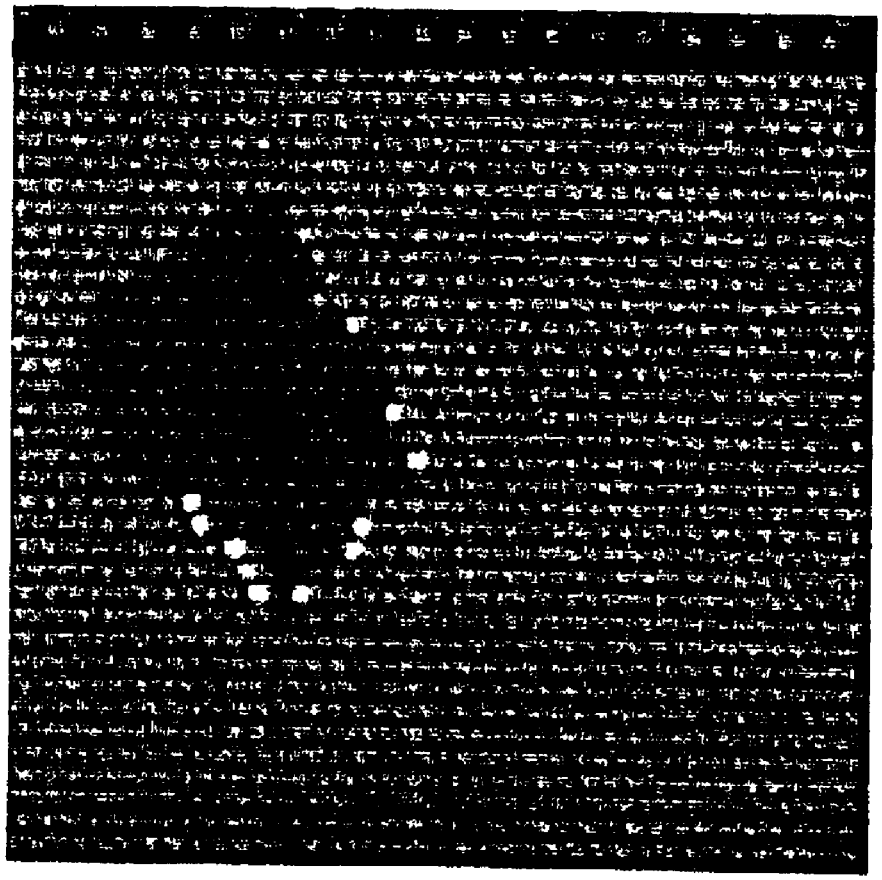
FIG. 4 depicts an SEM-VC hyper-extracting mode image showing both open and shorted N+ contacts in accordance with an embodiment of the invention.

FIG. 4 depicts a SEM-VC hyper-extracting mode image showing both open and shorted N+ contacts 102 in accordance with an embodiment of the invention. The open contacts show up as darker than the normal contacts in the image. The shorted contacts show up as brighter than the normal contacts in the image. The particular image of FIG. 4 was taken with hyper-extracting voltage at 1,100 volts and with landing energy of 800 eV. The image in FIG. 4 is roughly of the same area from the same memory as the images in FIGS. 2A and 2B.

The capability to see both open and shorted N+ contacts 102 in hyper-extracting mode is one advantage of the invention. In comparison, as described above in relation to FIGS. 2A and 2B, conventional SEM-VC can only see open N+ contacts 102 in retarding mode and can only see shorted N+contacts 102 in extracting mode. By going a little further, inspection of N+ and P+ contacts (contact etch or fill) in hyper extraction mode could detect open contacts and high resistance contacts both in N+ and P+ contacts in one inspection.

The applicant believes that the open N+ contacts 102 appear darker than normal N+ contacts 102 in hyper-extracting mode for the following reason. In hyper-extracting mode, the normal contacts undergo junction breakdown and so some current flows across the junction. The amount of current or contrast of normal N+ contacts is controllable. This results in electrons being extracted from the normal contacts. On the other hand, the open contacts are open circuited and so have significantly less electron flow despite the hyper-extracting voltage. Thus, the normal contacts appear brighter than the open contacts.

In hyper extraction mode, plugs could charge up much more positively than normal inspection conditions, and resistance difference can be visualized with controlled inspection parameters.

The applicant believes that the shorted N+ contacts 102 appear brighter than normal N+ contacts 102 in hyper-extracting mode for the following reason. In hyper-extracting mode, although some electrons are extracted out of the normal contacts due to junction breakdown, more electrons are extracted out of the shorted contacts due to the short circuit between the contact and ground. Thus, the shorted contacts appear brighter than the normal contacts.

Figure 1:
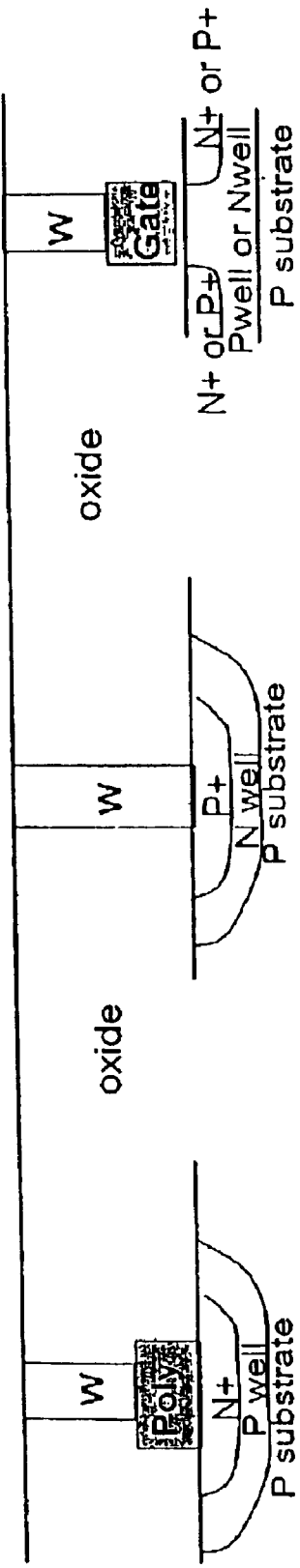
FIG. 1 is a cross-sectional diagram depicting three types of contacts.
Figure 5:
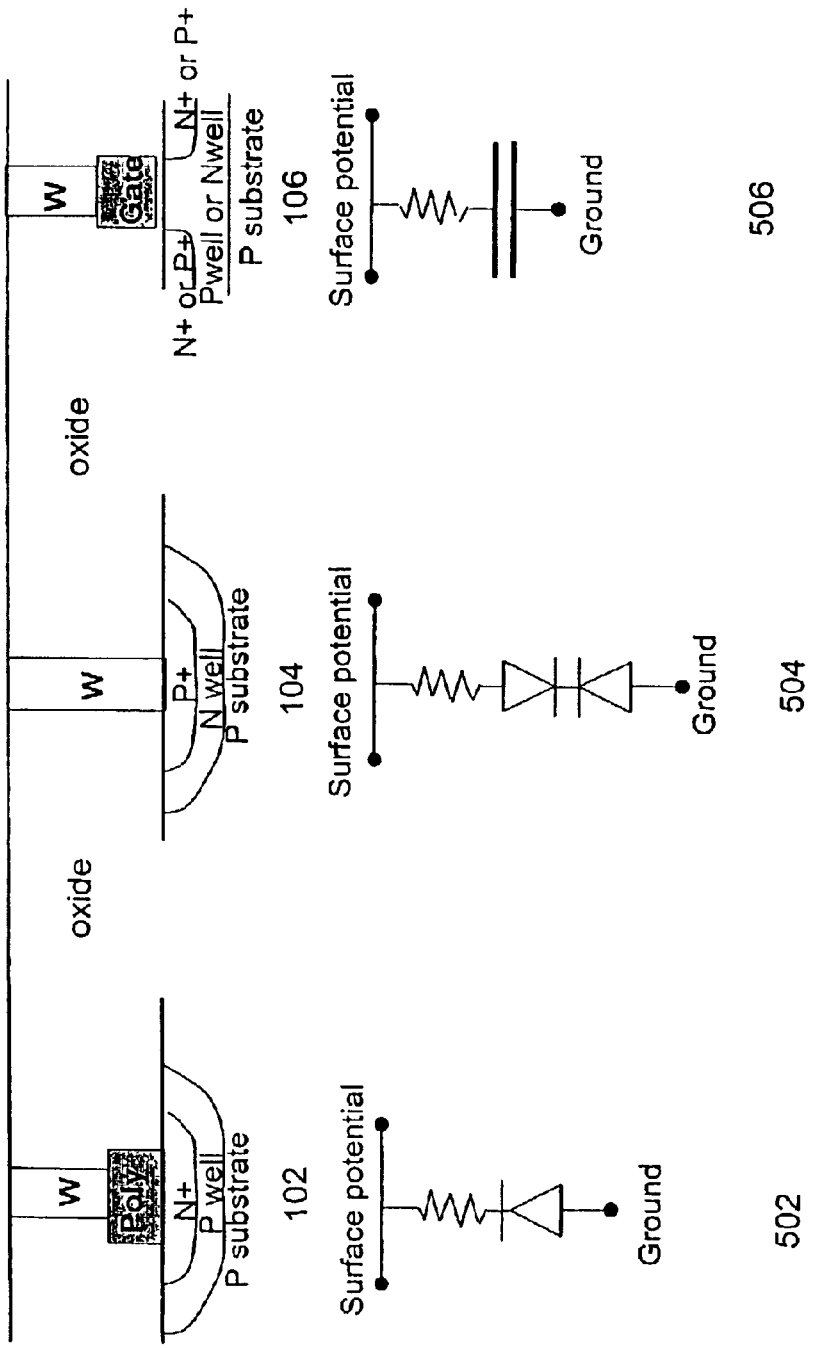
FIG. 5 shows corresponding circuit models for the three types of contacts in FIG. 1.

FIG. 5 shows corresponding circuit models for the three types of contacts in FIG. 1. The first circuit model 502 corresponds to the N+ contact 102. The first circuit model 502 comprises a resistor and PN diode between the surface potential and ground. The N+ contact well and the surrounding P well form the PN diode.

The second circuit model 504 corresponds to the P+ contact 104. The second circuit model 504 comprises a resistor and two PN diodes between the surface potential and ground. A first diode is formed by the P+ contact well and the surrounding N well, and a second diode is formed by the N well and the P substrate.

The third circuit model 506 corresponds to the gate contact 106. The third circuit model 506 comprises a resistor and a capacitor between the surface potential and ground. The capacitor is due to the thin gate oxide beneath the gate.

Figure 6A:
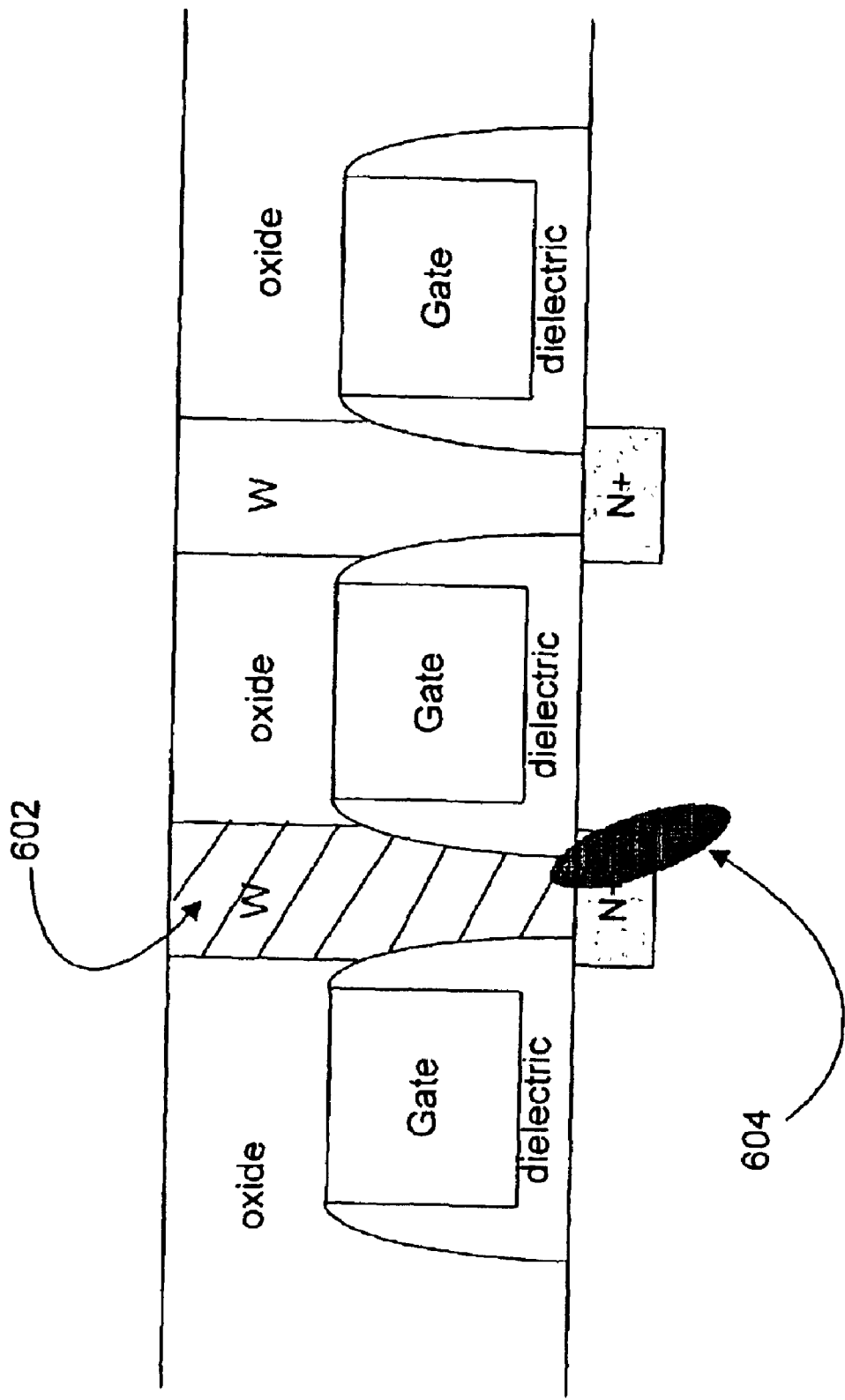
FIG. 6A is a cross-sectional diagram depicting an N+ contact with a contact-junction short circuit.

FIG. 6A is a cross-sectional diagram depicting an N+ contact 602 with a contact-junction short circuit 604. Here, the short circuit 604 provides a path directly from the tungsten plug to the P well that surrounds the N+ well. This effectively provides a current path that bypasses the PN diode normally formed by the N+ well and the surrounding P well.

Figure 6B:
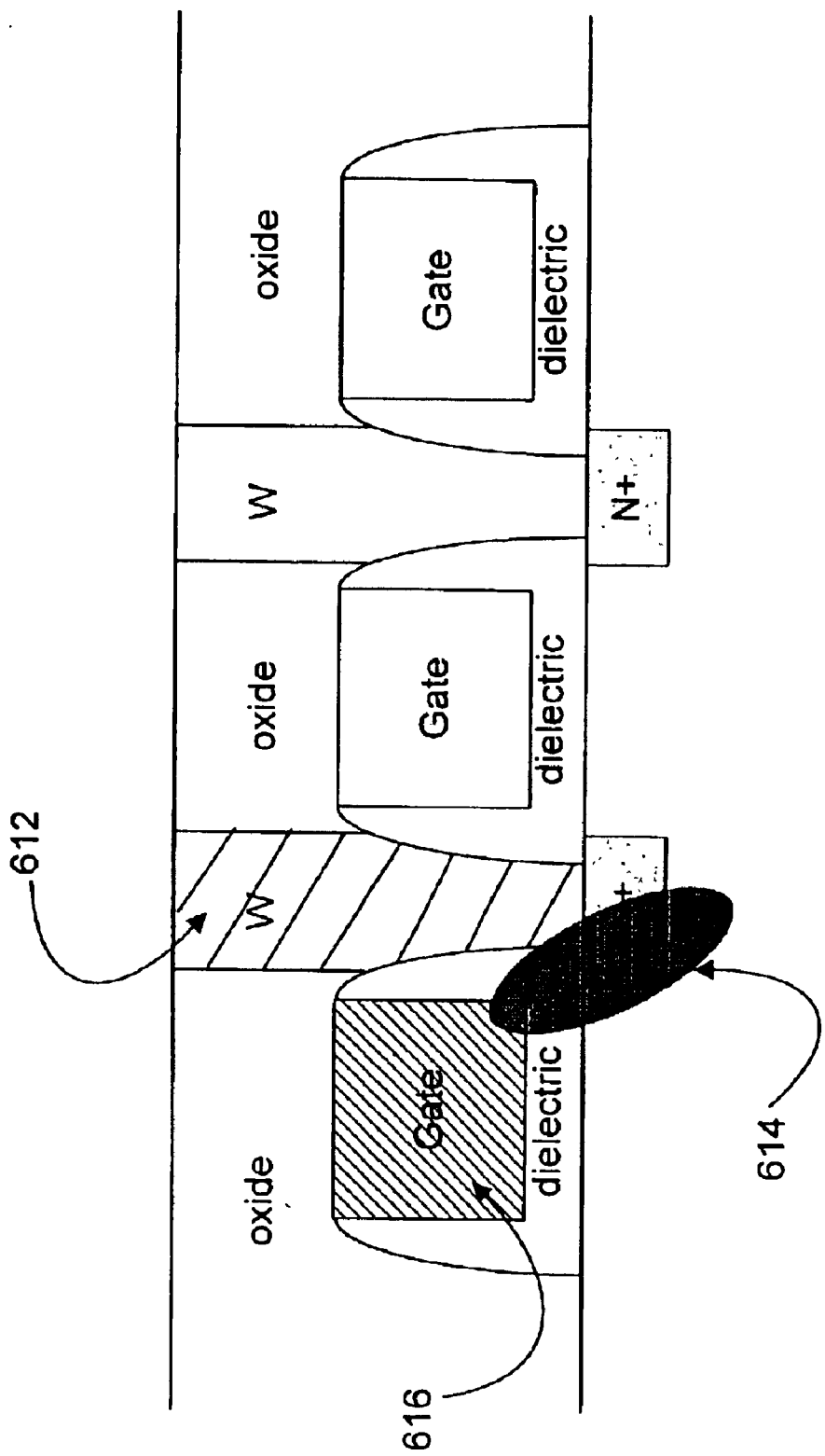
FIG. 6B is a cross-sectional diagram depicting an N+ contact with a contact-junction-gate short circuit.

FIG. 6B is a cross-sectional diagram depicting an N+ contact 612 with a contact-junction-gate short circuit 614. Here, the short circuit 614 provides a path from the surrounding P well both to the gate 616 and to the tungsten plug of the N+ contact 612. Not only does this effectively provide a current path from the tungsten that bypasses the PN diode normally formed by the N+ well and the surrounding P well, but it also grounds the gate 616.

Figure 6C:
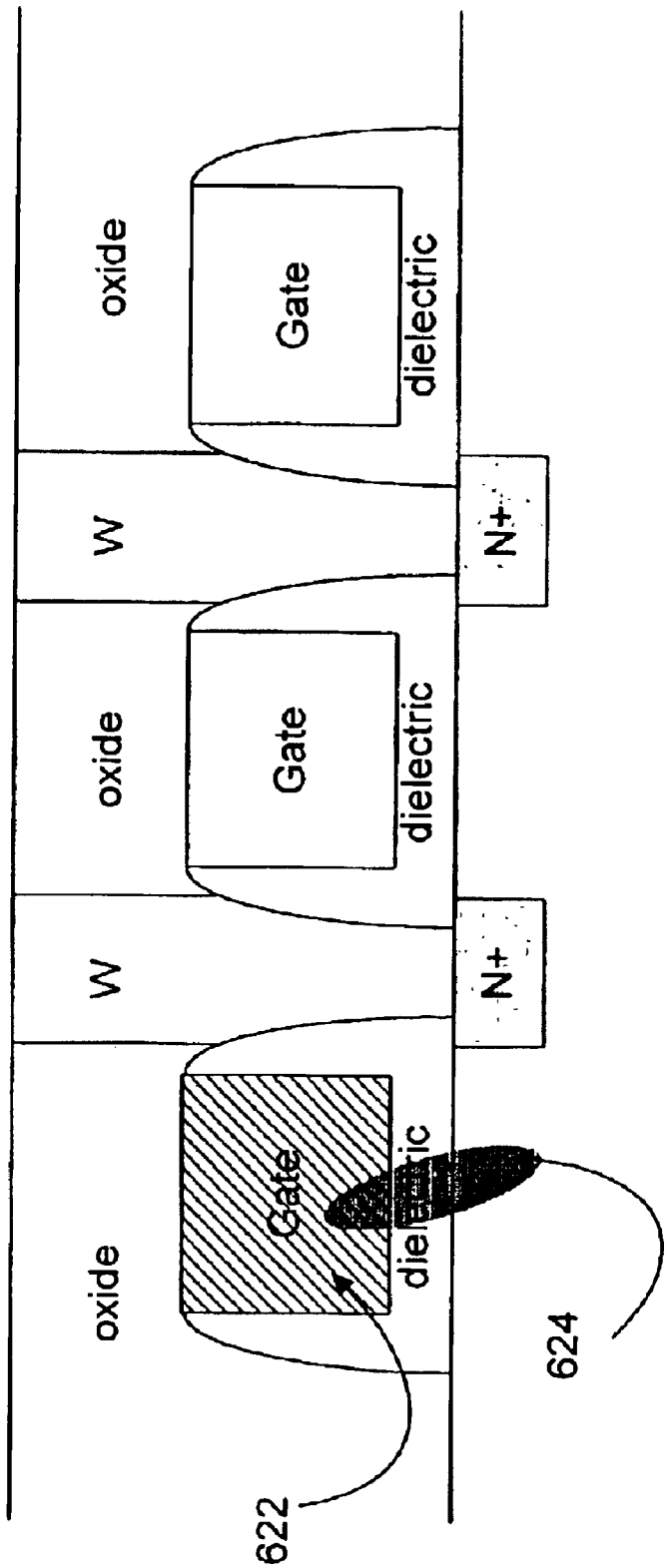
FIG. 6C is a cross-sectional diagram depicting a gate that is short-circuited to ground.

FIG. 6C is a cross-sectional diagram depicting a gate 622 that is short-circuited 624 to ground. Here, the short circuit 624 provides a path from the gate 622 to ground.

Figure 6D:
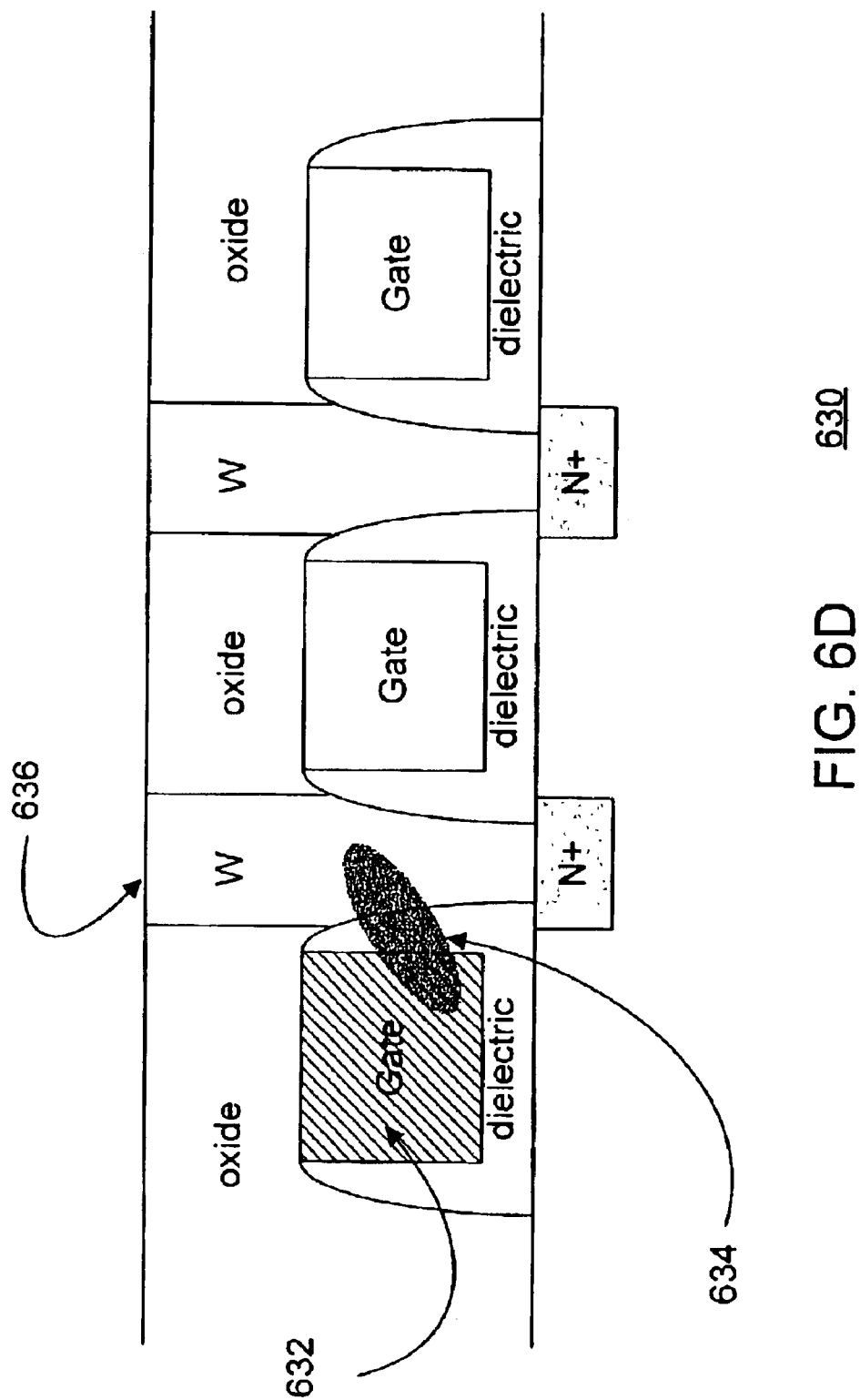
FIG. 6D is a cross-sectional diagram depicting a contact-gate short circuit that results in a floating gate.

FIG. 6D is a cross-sectional diagram depicting a contact-gate short circuit 634 that results in a floating gate 632. Here, the short circuit 634 is between the gate 632 and an adjacent tungsten plug for an N+ contact 636. This short circuit 634 leaves the gate floating (rather than grounded).

Figure 7A:
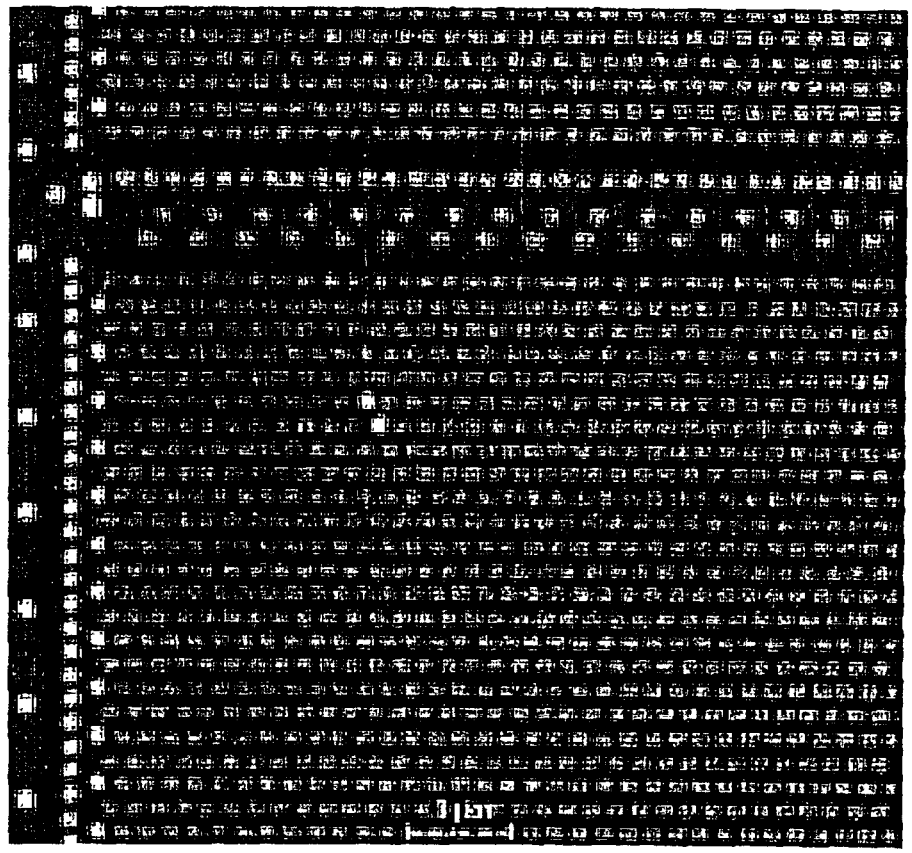
FIG. 7A depicts a conventional SEM-VC extracting mode image showing a couple of short-circuited N+ contacts.

FIG. 7A depicts a conventional SEM-VC extracting mode image showing a couple of short-circuited N+ contacts. The conventional extracting mode is able to detect that the two bright contacts towards the middle of the image are short circuited. However, disadvantageously, the conventional extracting mode is unable to distinguish between a contact-junction short circuit 604 as depicted in FIG. 6A and a contact-junction-gate short circuit 614 as depicted in FIG. 6B.

Figure 7B:
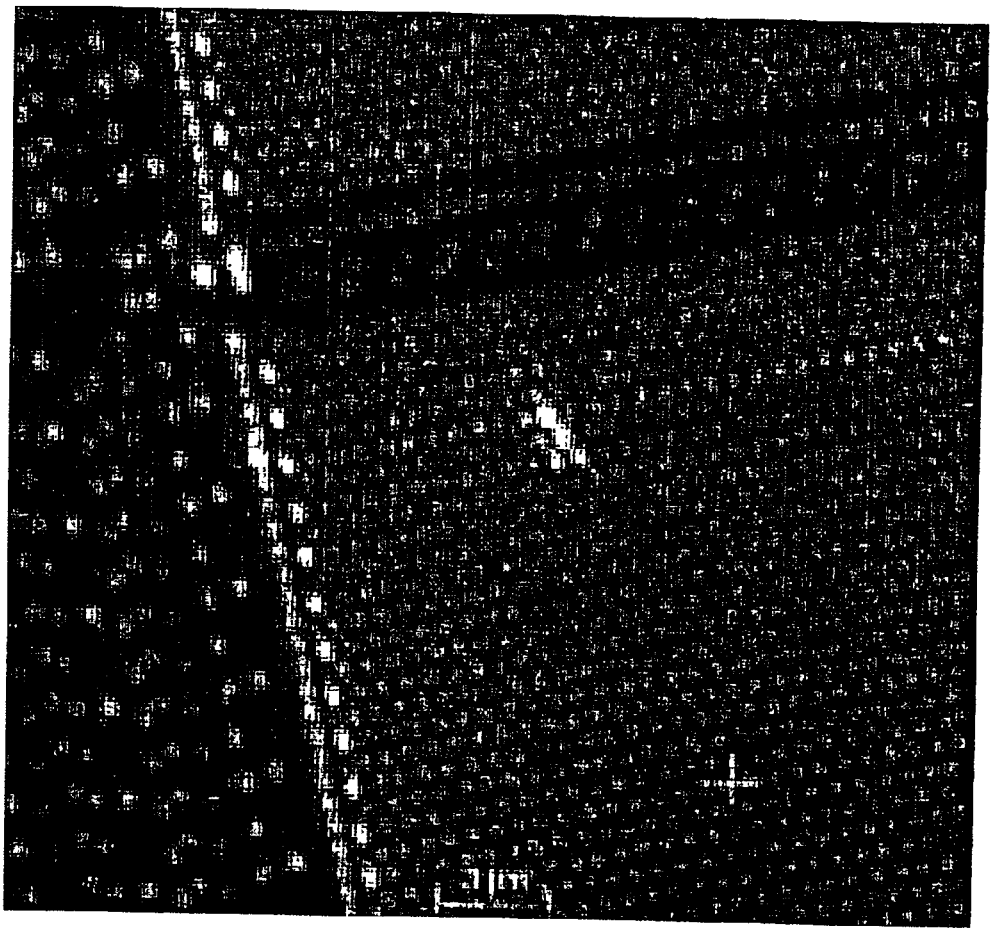
FIG. 7B depicts an SEM-VC hyper-extracting mode image showing the short-circuited N+ contacts at higher contrast than the conventional image in accordance with an embodiment of the invention.

FIG. 7B depicts an SEM-VC hyper-extracting mode image showing the short-circuited N+ contacts at higher contrast than the conventional image in accordance with an embodiment of the invention. As depicted in FIG. 7B, the short-circuited N+ contacts are now brighter in contrast to the surrounding area than they were in FIG. 7A. Applicants believe that the higher contrast is due to the positively charged surrounding oxide surface in hyper-extracting mode. Advantageously, the higher contrast may be used to increase the field of view during inspection, and an increased field of view may be used for faster throughput of wafers being inspected.

Figure 7C:
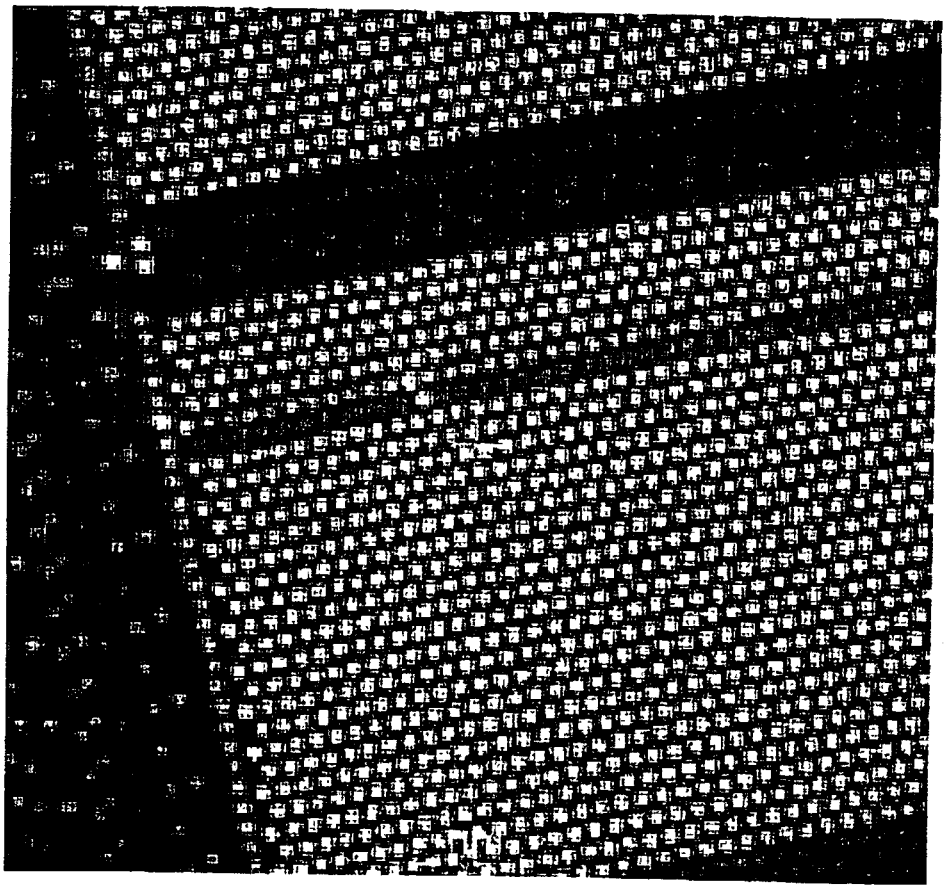
FIG. 7C depicts an SEM-VC hyper-extracting mode image revealing that the short circuit comprises a contact-junction-gate short circuit in accordance with an embodiment of the invention.

FIG. 7C depicts an SEM-VC hyper-extracting mode image revealing that one of the short circuits comprises a contact-junction-gate short circuit 614 in accordance with an embodiment of the invention. The contact-junction-gate short circuit 614 is revealed by the darkened row of contacts going through one of the bright (short-circuited) N+ contacts. Thus, in this embodiment, the application of the hyper-extracting field is able to advantageously identify the "defect path" of the short circuit. In this case, the defect path distinguishes between a contact short with a defective gate and without a defective gate. Here, the particular defect path identified comprises a defective gate due to the presence of a contact-junction-gate short circuit 614.

Figure 8:
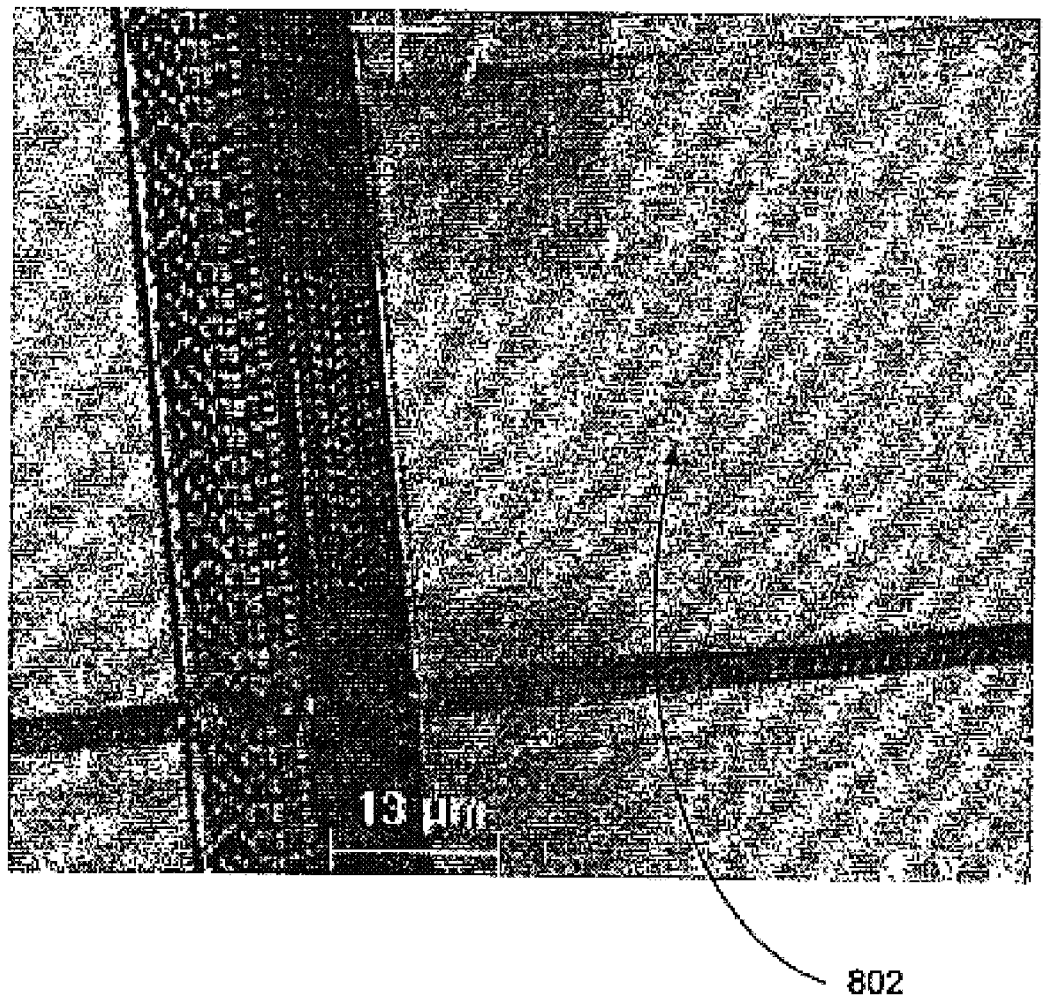
FIG. 8 depicts an SEM-VC hyper-extracting mode image indicating a gate that is short-circuited to ground in accordance with an embodiment of the invention.

FIG. 8 depicts an SEM-VC hyper-extracting mode image indicating a gate 622 that is short-circuited 624 to ground in accordance with an embodiment of the invention. The shorted gate 622 is indicated by the slightly brighter (near horizontal) row of contacts 802 in FIG. 8. In this embodiment, the application of the hyper-extracting field advantageously identifies the shorted gate 622.

Figure 9:
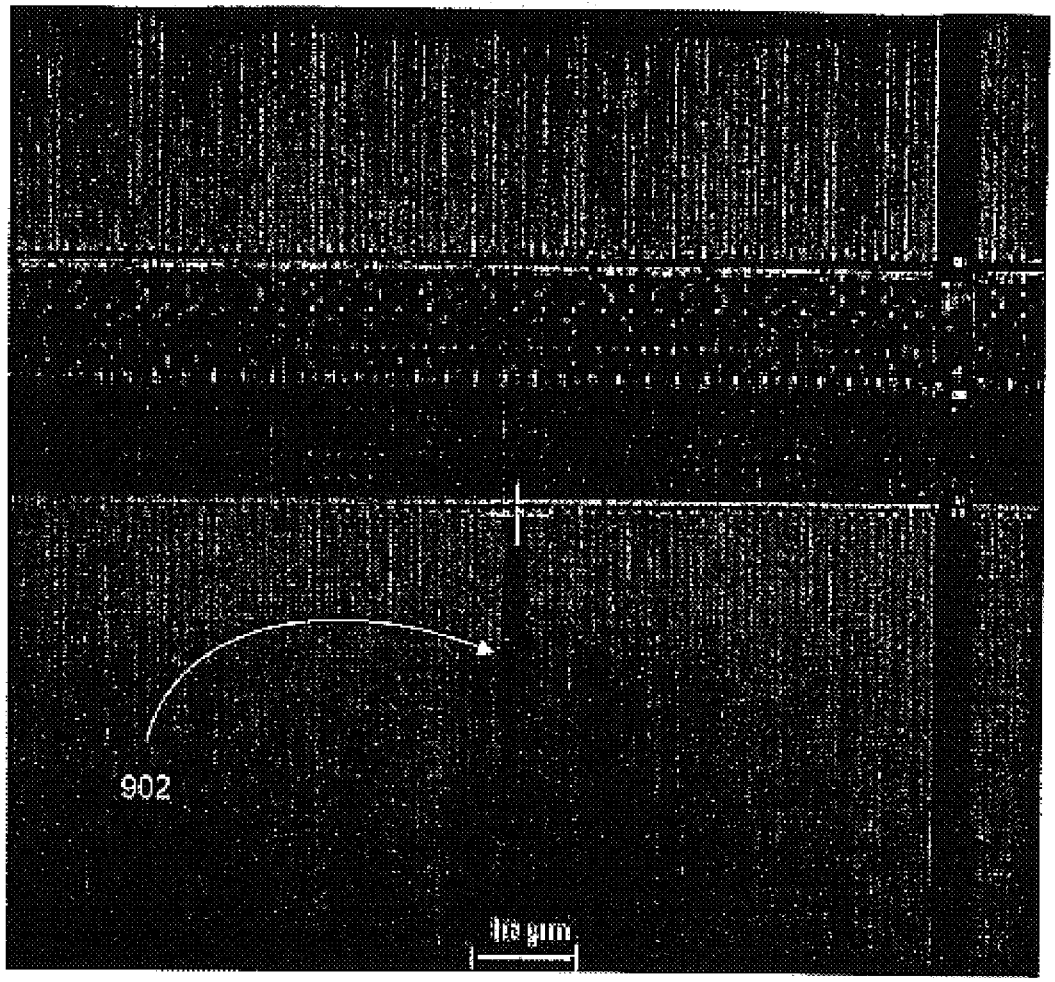
FIG. 9 depicts an SEM-VC hyper-extracting mode image indicating a contact-gate short circuit that results in a floating gate in accordance with an embodiment of the invention.

FIG. 9 depicts an SEM-VC hyper-extracting mode image indicating a contact-gate short circuit 634 that results in a floating gate 632 in accordance with an embodiment of the invention. The floating gate 632 is indicated by the darker (vertical) column of contacts 902 in FIG. 9. In this embodiment, the application of the hyper-extracting field advantageously identifies the floating gate 632.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method for electron beam inspection of a semiconductor specimen, the method comprising:

applying a hyper-extracting field between the specimen and an extracting electrode, wherein the hyper-extracting field is sufficient to achieve a junction breakdown in a plurality of semiconductor circuits on the specimen;

generating image data from intensities of electrons hyper-extracted from contacts of the semiconductor circuits; and identifying a type of gate defect from the image data.

2. The method of claim 1, wherein the type of ate defect comprises a contact-junction-gate short circuit, and wherein the contact-junction-gate short circuit is identified by a line of contacts with lower electron intensities in the image data and a contact in that line with higher electron intensities in the image data.

3. The method of claim 1, wherein the type of gate defect comprises a grounded gate, and wherein the grounded gate is identified by a line of contacts with slightly higher electron intensities in the image data.

4. The method of claim 1, wherein the type of gate defect comprises a contact-gate short circuit which results in a floating gate, and wherein the contact-gate short circuit is identified by a line of contacts with lower electron intensities in the image data.

5. The method of claim 1, wherein the contacts include N+ contacts.

6. A method for electron beam inspection of a semiconductor specimen, the method comprising:

applying a hyper-extracting field between the semiconductor specimen and an extracting electrode, wherein the hyper-extracting field is sufficient to achieve a junction breakdown;

generating image data from intensities of electrons hyper-extracted from the semiconductor specimen; and identifying both a normally extracting voltage contrast defect and a normally retarding voltage contrast defect from the image data.

7. The method of claim 6, wherein the normally extracting voltage contrast defect comprises a shorted contact, and wherein the normally retarding voltage contrast defect comprises an open contact.

8. The method of claim 7, wherein, in comparison to non-defective contacts, the shorted contact appears with a higher intensity in the image data, and the open contact appears with a lower intensity in the image data.

* * * * *